United States Patent [19]
MacGregor et al.

[11] Patent Number: 5,810,608
[45] Date of Patent: Sep. 22, 1998

[54] CONTACT PAD EXTENDER FOR INTEGRATED CIRCUIT PACKAGES

[75] Inventors: Duncan D. MacGregor, Shingle Springs; Rodney K. Rose, Roseville, both of Calif.

[73] Assignee: Intel Corporation, Santa Clara, Calif.

[21] Appl. No.: 730,146

[22] Filed: Oct. 15, 1996

[51] Int. Cl.[6] ............................................. G06F 15/20
[52] U.S. Cl. .......................... 439/69; 257/713; 361/695
[58] Field of Search ..................... 361/694, 695, 361/696, 697, 687; 257/712, 713, 718, 719, 721; 439/69, 70, 485, 487

[56] References Cited

U.S. PATENT DOCUMENTS

| | | | |
|---|---|---|---|
| 3,672,047 | 6/1972 | Sakamoto et al. | 228/180.5 |
| 4,230,901 | 10/1980 | Wengler et al. | 361/717 |
| 4,542,438 | 9/1985 | Yamamoto | 228/180.5 |
| 4,842,184 | 6/1989 | Miller, Jr. | 228/41 |
| 4,860,165 | 8/1989 | Cassinelli | 257/713 |
| 5,203,075 | 4/1993 | Angulas et al. | 29/840 |
| 5,483,102 | 1/1996 | Neal et al. | 257/713 |
| 5,509,203 | 4/1996 | Yamashita | 29/879 |
| 5,710,695 | 1/1998 | Manteghi | 361/717 |

*Primary Examiner*—Neil Abrams
*Attorney, Agent, or Firm*—Blakely, Sokoloff, Taylor & Zafman

[57] ABSTRACT

An integrated circuit package that contains a fan assembly which is mounted to the package. The package includes a printed circuit board substrate which has a top surface, an opposite bottom surface and an inner die cavity. A plurality of pins extend from the bottom surface of the substrate so that the package can be connected to an external printed circuit board. A metal lid may be mounted to the top surface to enclose an integrated circuit located within the die cavity of the substrate. The integrated circuit may be mounted to the lid and is electrically coupled to the pins by various routing features of the package. The package includes a plurality of metal disks that are soldered to corresponding surface pads on the top surface of the substrate. The lid exposes the disks. A fan assembly is mounted to the lid and connected to the disks so that the fan receives electrical current through the package.

11 Claims, 2 Drawing Sheets

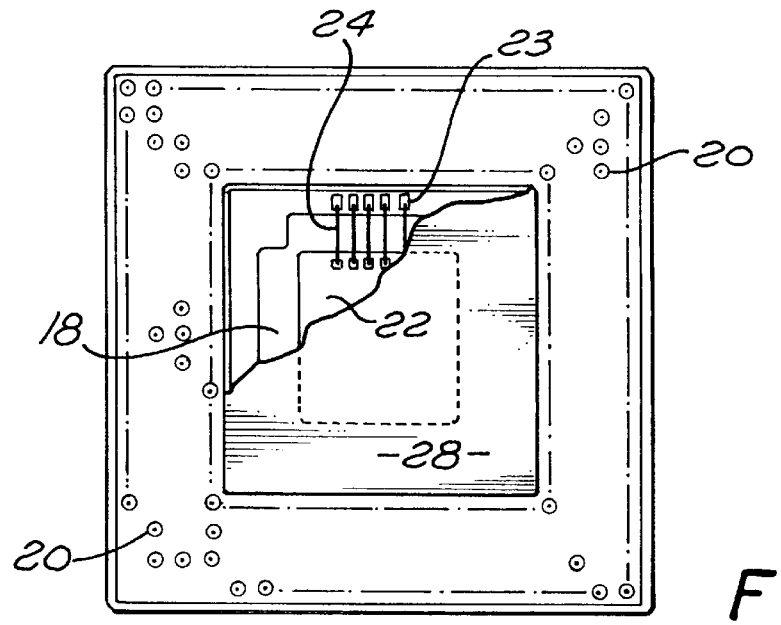
FIG. 2
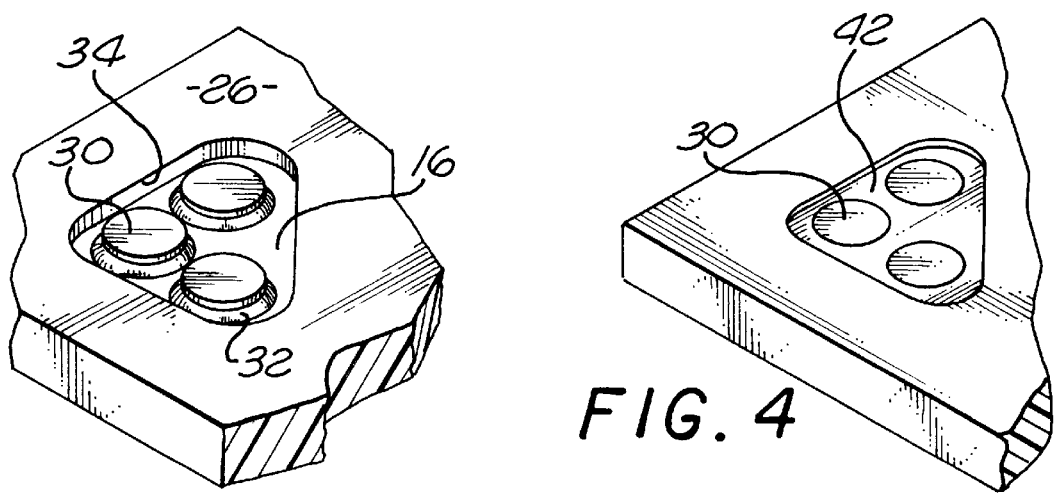
FIG. 3
FIG. 4
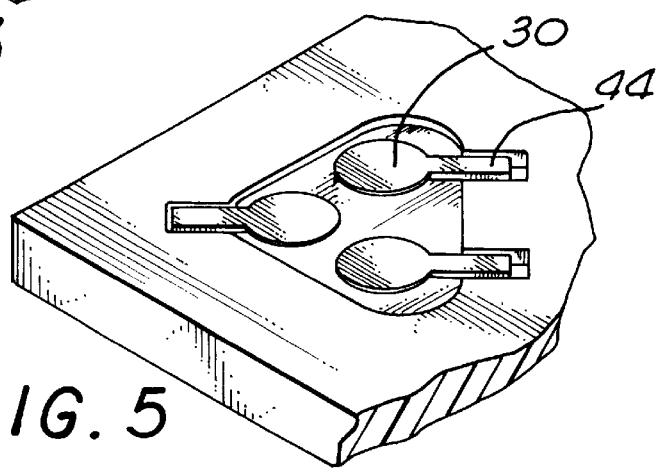
FIG. 5

CONTACT PAD EXTENDER FOR INTEGRATED CIRCUIT PACKAGES

BACKGROUND OF THE INVENTION

1. Field of the Invention

The present invention relates to an integrated circuit package.

2. Description of Related Art

Integrated circuits (ICs) are typically assembled into a package that is mounted to a printed circuit board. The package must be constructed to remove the heat generated by the integrated circuit while maintaining the junction temperatures of the device below critical values. To improve thermal efficiency there has been developed integrated circuit packages which have a fan assembly mounted to the top of the package. To reduce wiring, the contacts of the fans are attached to corresponding surface pads of the package. The pads allow the fan to receive power and transmit other signals through the IC package.

The surface pads are formed on packages utilizing conventional ceramic co-fired packaging processes. Ceramic packages are relatively expensive to produce. It would be desirable to provide a plastic package which contains an integral fan that is powered through the package.

SUMMARY OF THE INVENTION

The present invention is an integrated circuit package that contains a fan assembly which is mounted to the package. The package includes a printed circuit board substrate which has a top surface, an opposite bottom surface and an inner die cavity. A plurality of pins extend from the bottom surface of the substrate so that the package can be connected to an external printed circuit board. A metal lid may be mounted to the top surface to enclose an integrated circuit located within the die cavity of the substrate. The integrated circuit is electrically coupled to the pins by various routing features of the package. The package includes a plurality of metal disks that are soldered to corresponding surface pads on the top surface of the substrate. The lid exposes the disks. A fan assembly is mounted to the lid and connected to the disks so that the fan receives electrical current through the package.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 2 is a bottom view of the integrated circuit package;

FIG. 3 is an enlarged perspective view showing a plurality of fan contacts of the package;

FIG. 4 is an enlarged perspective view showing an alternate embodiment of the fan contacts;

FIG. 5 is an enlarged perspective view showing an alternate embodiment of the fan contacts;

DETAILED DESCRIPTION OF THE INVENTION

Figure 1:
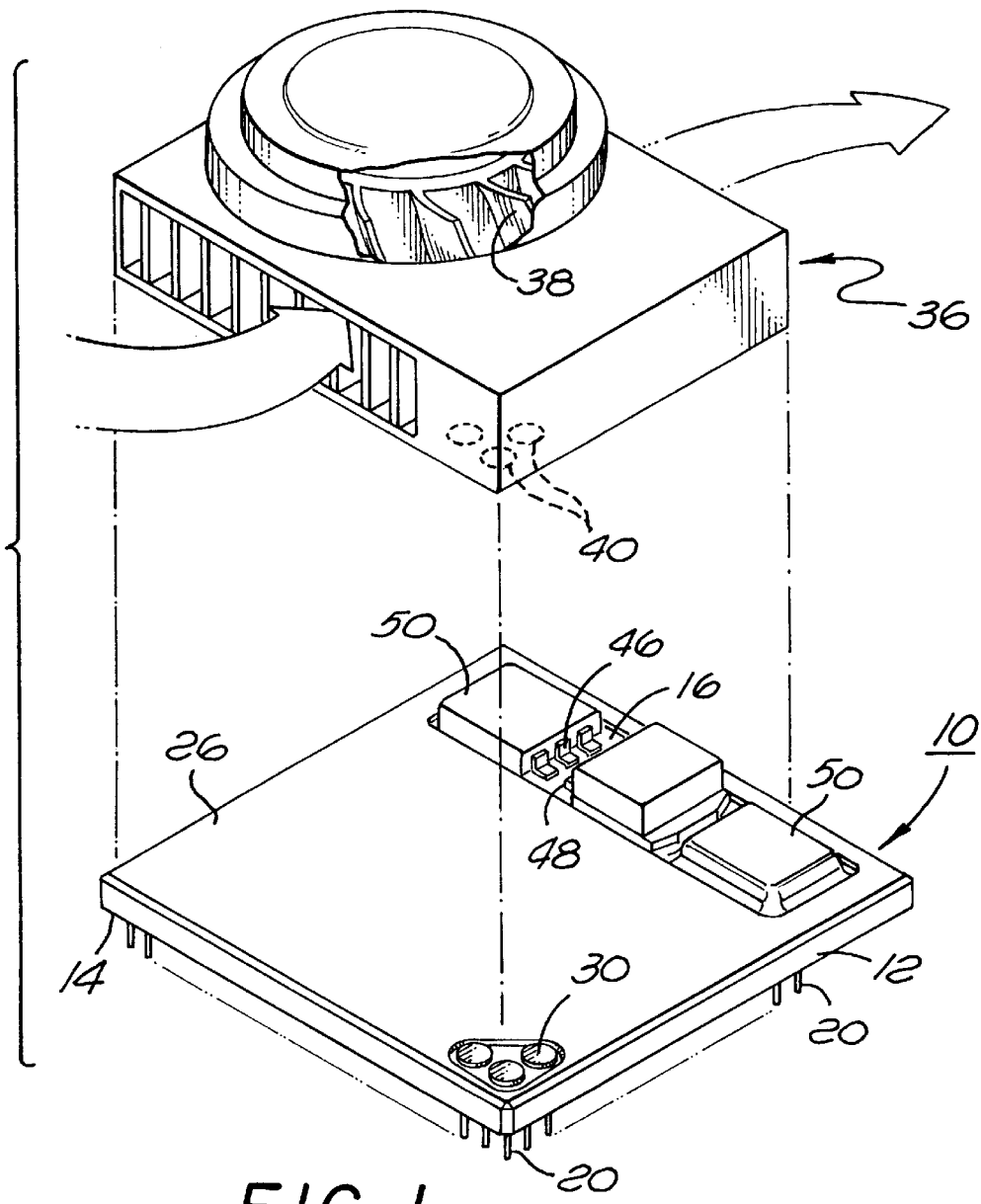
FIG. 1 is an exploded view of an integrated circuit package of the present invention.

Referring to the drawings more particularly by reference numbers, FIGS. 1 and 2 show an integrated circuit package 10 of the present invention. The package 10 includes a substrate 12 which has a bottom surface 14, an opposite top surface 16 and an inner die cavity 18. A plurality of pins 20 extend from the bottom surface 14 of the substrate 12. The pins 20 allow the package 10 to be connected to an external printed circuit board (not shown).

The package 10 contains an integrated circuit 22 that is located within the die cavity 18 of the substrate 12. The substrate 12 preferably contains surface pads, vias and internal routing layers (not shown) constructed from conventional printed circuit board processes. The integrated circuit 22 is coupled to internal surface pads 23 of the substrate 12 by wire bonds 24. The internal routing of the substrate 12 electrically couples the integrated circuit 22 to the external pins 20.

The integrated circuit 22 is preferably mounted to a metal lid 26 that is mounted to the top surface 16 of the substrate 12. The die cavity 18 may also be filled with an encapsulant 28 which together with the lid 26 enclose the integrated circuit 22. In addition to providing a thermal sink the lid 26 may also function as an electrical ground plane for the integrated circuit 22.

As shown in FIG. 3, the package 10 includes a plurality of metal disks 30 that are soldered to fan surface pads 32 formed on the top surface 14 of the substrate 12. The lid 26 has an opening 34 that exposes the disks 30. The disks 30 are preferably stamped from a sheet of gold plated phosphor-bronze material and soldered to the substrate 12 with known surface mount technology. The metal disks 30 may be provided on a tape to allow the use of automated pick and place equipment for assembling the disks 30 to the substrate 12.

Referring to FIG. 1, a fan assembly 36 is mounted to the top of the lid 26. The fan assembly 36 may be mounted to the lid 26 with a thermal epoxy (not shown). The assembly 36 contains a fan 38 that creates an airstream which flows across the lid 26 and removes heat generated by the integrated circuit 22.

The fan assembly 36 includes a plurality of electrical contacts 40 that make electrical contact with the disk 30 of the substrate 12. By way of example, the contacts 40 may be spring biased into the disks 30. The disks 30 are coupled to the power and ground planes of the substrate 12 so that the fan 38 can be powered through the package 10. The disks 30 essentially extend the surface pads 32 of the substrate 12 through the opening 34 so that the fan assembly 36 can be mounted to a plastic package which contains an outer metal lid 26.

FIG. 4 shows an alternate embodiment wherein the disks 30 are initially surrounded by an outer plastic case 42 before being soldered to the surface pads 32 of the substrate 12. The outer case 42 allows all three disks 30 to be simultaneously placed and soldered to the substrate 12, thereby reducing the handling time of the parts. FIG. 5 shows another alternate embodiment wherein each disk 30 has a solder tab 44 that is connected to the fan assembly 36. The existence of the solder tab 44 improves the visual inspection of the solder joints.

Referring to FIG. 1, the package 10 may have a plurality of devices 46 and 48 mounted to the top surface 14 of the substrate 12. The devices 46 and 48 may be capacitors and a voltage regulator, respectively, for the integrated circuit 22. Shrouds 50 may be punched into the lid 26 to protect the devices 46 and 48. Alternatively, the shrouds 50 may be assembled as components separate from the lid 26.

The package 10 is preferably assembled by initially providing the substrate 12. The pins 20 are soldered to the bottom surface 16 and the disks 30 are attached to the surface pads 32 utilizing known solder techniques. The external devices 46 and 48 can be attached during the soldering process of the disks 30.

The lid 26 is mounted to the top surface 16 of the substrate 12. The integrated circuit 22 is then mounted to the lid 26. The integrated circuit 22 is wire bonded to the substrate 12 and the die cavity 18 is filled with encapsulant 28. The fan assembly 36 is then mounted to the lid 26 and connected to the disks 30 to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

Figure 6:
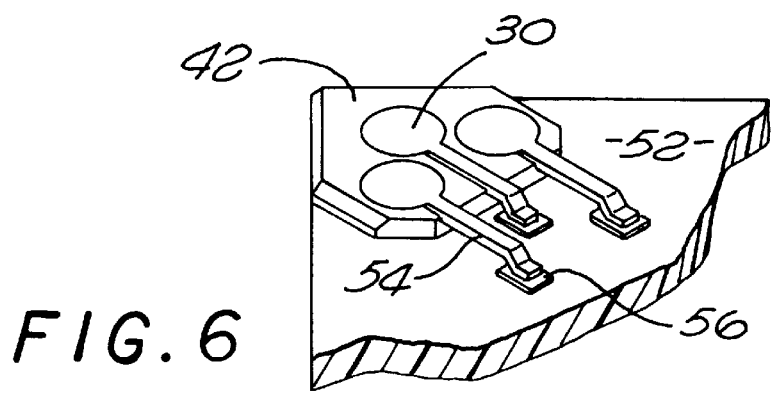
FIG. 6 is an enlarged perspective view showing the fan contacts on a plastic package.

For example, as shown in FIG. 6, the disks 30 and outer case 42 may be mounted to a plastic pin grid array (PPGA) package 52. The disk 30 may have fingers 54 that are electrically connected to surface pads 56 of the package 52.

What is claimed is:

1. An integrated circuit package that can be coupled to a fan, comprising:

a substrate that has a bottom surface, an opposite top surface and a die cavity, said top surface having a plurality of fan surface pads;

a plurality of contacts located at said bottom surface of said substrate coupled to said integrated circuit;

a plurality of disks that are attached to said fan surface pads to provide an electrical connection to the fan;

a lid that is attached to said top surface of said substrate and which has an opening which exposes said disks; and, an integrated circuit that is mounted to said lid, located within said die cavity and coupled to said substrate.

2. The package as recited in claim 1, further comprising a fan that is mounted to said lid and connected to said disks.

3. The package as recited in claim 1, wherein said disks are surrounded by a dielectric material.

4. The package as recited in claim 3, wherein said disks each have a solder tab.

5. The package as recited in claim 1, wherein said contacts are pins.

6. The package as recited in claim 1, further comprising a plurality of secondary devices that are mounted to said top surface of said substrate.

7. The package as recited in claim 6, wherein said lid has a shroud which covers said secondary devices.

8. The package as recited in claim 6, wherein said secondary devices include a capacitor.

9. The package as recited in claim 6, wherein said secondary devices include a voltage regulator.

10. A method for assembling an integrated circuit package, comprising the steps of:

a) providing a substrate which has a bottom surface and an opposite top surface, said top surface having a plurality of fan surface pads;

b) attaching a plurality of disks to said fan surface pads;

c) mounting a lid to said top surface of said substrate, said lid having an opening that exposes said disks;

d) mounting an integrated circuit to said lid; and, e) coupling said integrated circuit to said substrate.

11. The method as recited in claim 10, further comprising the step of mounting a fan to said lid and connecting said fan to said disks.

* * * * *